(12) United States Patent
Ji et al.

(10) Patent No.: US 11,315,879 B2
(45) Date of Patent: Apr. 26, 2022

(54) PACKAGE SUBSTRATE AND MULTI-CHIP PACKAGE INCLUDING THE SAME

(71) Applicant: SAMSUNG ELECTRO-MECHANICS CO., LTD., Suwon-si (KR)

(72) Inventors: Yun Je Ji, Suwon-si (KR); Tae Seong Kim, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 171 days.

(21) Appl. No.: 16/803,764

(22) Filed: Feb. 27, 2020

(65) Prior Publication Data
US 2021/0175176 A1    Jun. 10, 2021

(30) Foreign Application Priority Data
Dec. 10, 2019  (KR) .................. 10-2019-0163279

(51) Int. Cl.
*H01L 23/538*  (2006.01)
*H01L 23/498*  (2006.01)
(Continued)

(52) U.S. Cl.
CPC ...... *H01L 23/5386* (2013.01); *H01L 21/4853* (2013.01); *H01L 21/4857* (2013.01);
(Continued)

(58) Field of Classification Search
CPC ............ H01L 23/5386; H01L 23/5383; H01L 23/49811; H01L 23/5381; H01L 23/13; H01L 23/49827; H01L 23/481; H01L 23/525; H01L 23/485; H01L 25/0655; H01L 2224/24155; H01L 2224/24225–24227; H01L 24/18–25; H01L 2224/18–225; H01L 2224/82–82986; H01L 21/02282–0229; H01L 21/02623–02628; H01L 21/208–2085; H01L 21/288–2885; H01L 21/445; H01L 23/498–49894;
(Continued)

(56) References Cited

U.S. PATENT DOCUMENTS 5,120,678 A * 6/1992 Moore .................. H01L 24/83
29/840
2017/0236790 A1* 8/2017 Chinnusamy ....... H01L 23/5227
257/774
(Continued)

FOREIGN PATENT DOCUMENTS

KR        10-0691443 B1    3/2007
WO    WO-2016185607 A1 * 11/2016 ............... H05K 1/02

*Primary Examiner* — Selim U Ahmed
*Assistant Examiner* — Evan G Clinton
(74) *Attorney, Agent, or Firm* — Morgan, Lewis & Bockius LLP

(57) ABSTRACT

A package substrate, including a substrate, a first structure disposed on the substrate and having a first through-portion, a first wiring layer disposed in the first through-portion on the substrate, a first insulating layer disposed in the first through-portion on the substrate and covering at least a portion of the first wiring layer, and a second wiring layer disposed on the first insulating layer, and a multi-chip package, including the package substrate, are provided.

19 Claims, 6 Drawing Sheets

(51) Int. Cl.
*H01L 25/065* (2006.01)
*H01L 21/48* (2006.01)
*H01L 23/00* (2006.01)

(52) U.S. Cl.
CPC .... *H01L 23/49811* (2013.01); *H01L 23/5381* (2013.01); *H01L 23/5383* (2013.01); *H01L 24/16* (2013.01); *H01L 24/17* (2013.01); *H01L 25/0655* (2013.01); *H01L 2224/16227* (2013.01); *H01L 2224/1703* (2013.01)

(58) Field of Classification Search
CPC ..... H01L 23/538–5389; H01L 23/3128; H01L 21/4846–4867; H01L 21/4807–481
See application file for complete search history.

(56) References Cited

U.S. PATENT DOCUMENTS

| | | | |
|---|---|---|---|
| 2018/0145031 A1 | 5/2018 | Braunisch et al. | |
| 2020/0006697 A1* | 1/2020 | Jung | H01L 51/5246 |
| 2021/0050296 A1* | 2/2021 | Tsai | H01L 23/585 |
| 2021/0111125 A1* | 4/2021 | Chen | H01L 24/08 |

* cited by examiner

PACKAGE SUBSTRATE AND MULTI-CHIP PACKAGE INCLUDING THE SAME

CROSS-REFERENCE TO RELATED APPLICATION(S)

This application claims the benefit under 35 USC 119 (a) of Korean Patent Application No. 10-2019-0163279 filed on Dec. 10, 2019 in the Korean Intellectual Property Office, the entire disclosure of which is incorporated herein by reference for all purposes.

TECHNICAL FIELD

The present disclosure relates to a package substrate and a multi-chip package including the same.

BACKGROUND

As compared with a case in which an entire system chip is manufactured using a single silicon die, in a case in which a die is divided into chiplets, manufacturing costs of chips may be further reduced and disposal costs resulting from poor yield may also be reduced. With the recent trend for chiplets, technologies for interconnection between chiplets have emerged. For example, a substrate including a silicon interposer, a substrate including a silicon-based interconnect bridge, capable of achieving a die-to-die a die-to-die electrical connection, and the like, have been developed. However, such technologies are required to manufacture expensive silicon interconnect dies. Additionally, in the case of a silicon-based interconnect bridge, a reliability issue arises due to a coefficient of thermal expansion (CTE) mismatch between a silicon material of the bridge and an organic material of a substrate.

SUMMARY

An aspect of the present disclosure is to provide a package substrate, capable of providing a relatively cheap multi-chip interconnection, and a multi-chip package including the same.

Another aspect of the present disclosure is to provide a package substrate, capable of lowering a yield reduction risk, and a multi-chip package including the same.

Another aspect of the present disclosure is to provide a package substrate, having a high degree of freedom in wiring design, and a multi-chip package including the same.

Another aspect of the present disclosure is to provide a package substrate having improved reliability, advantageous for bending control, and a multi-chip package including the same.

Another aspect of the present disclosure is to provide a package substrate, capable of forming a slim structure, and a multi-chip package including the same.

According to an aspect of the present disclosure, a fine circuit is implemented by forming a dam-shaped structure on a structure and sequentially forming a wiring layer, an insulating layer, and the like, in a through-portion provided through the structure.

For example, a package substrate includes a substrate, a first structure disposed on the substrate and having a first through-portion, a first wiring layer disposed in the first through-portion on the substrate, a first insulating layer disposed in the first through-portion on the substrate and covering at least a portion of the first wiring layer, and a second wiring layer disposed on the first insulating layer.

For example, a multi-chip package includes a package substrate including a substrate, a first structure disposed on the substrate and having a first through-portion, a first wiring layer disposed in the first through-portion on the substrate, a first insulating layer disposed in the first through-portion on the substrate and covering at least a portion of the first wiring layer, and a second wiring layer disposed on the first insulating layer, a first semiconductor chip disposed on the package substrate and having first connection pads, and a second semiconductor chip disposed around the first semiconductor chip on the package substrate and having second connection pads. At least one of the first connection pads and at least one of the second connection pads are electrically connected to each other through the first wiring layer.

For example, a package substrate includes a substrate, a dam-shaped structure disposed on the substrate, first patterns disposed inside the dam-shaped structure and on the substrate, second patterns disposed outside the dam-shaped structure and on the substrate, an insulating layer covering only the first patterns among the first patterns and the second patterns, a wiring layer disposed on the first insulating layer, and a via layer disposed in the first insulating layer and connecting the first patterns to the wiring layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Figure 1:
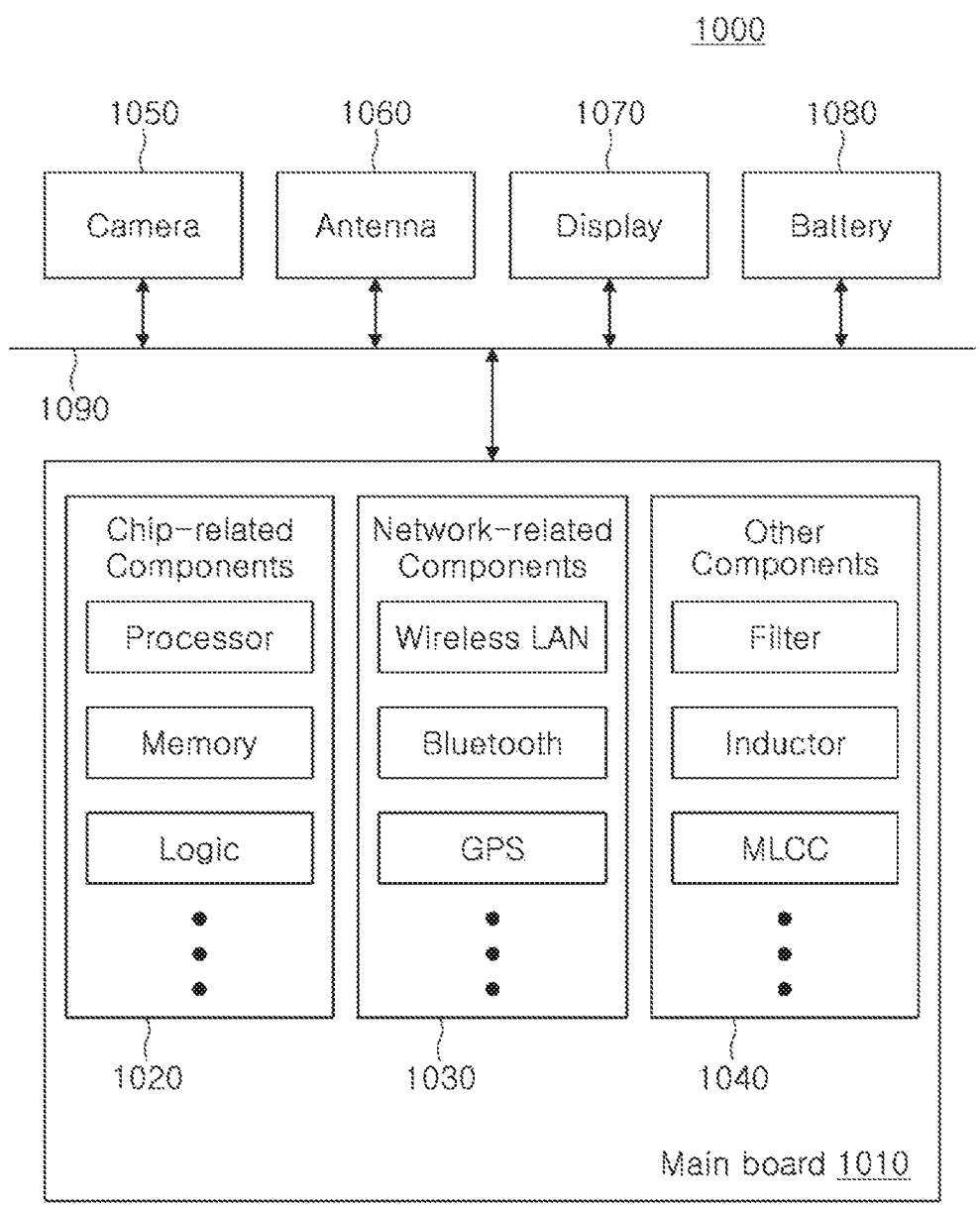
FIG. 1 is a schematic block diagram illustrating an example of an electronic device system.

FIG. 1 is a schematic block diagram illustrating an example of an electronic device system.

Referring to FIG. 1, an electronic device 1000 accommodates a mainboard 1010. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. The chip related components 1020 may be in the form of a package including the above-described chips or electronic components.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
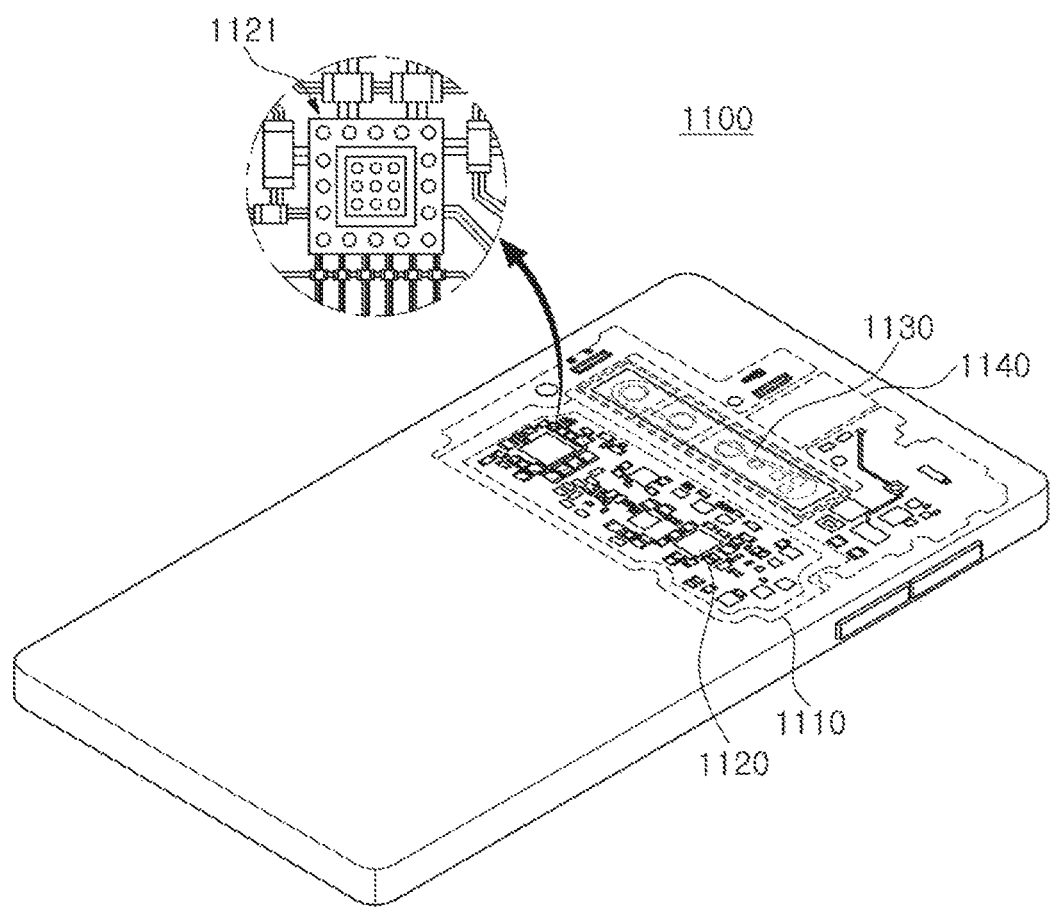
FIG. 2 is a schematic perspective view illustrating an example of an electronic device.

FIG. 2 is a schematic perspective view illustrating an example of an electronic device.

Referring to the drawings, an electronic device may be, for example, a smartphone 1100. The main board 1110 may be accommodated in the smartphone 1100, and various electronic components 1120 may be physically and/or electrically connected to the main board 1110. In addition, other electronic components, such as the camera module 1130 and/or the speaker 1140, which may or may not be physically and/or electrically connected to the main board 1110 may be accommodated therein. A portion of the electronic components 1120 may be the above-described chip related components, for example, a semiconductor package 1121, but are not limited thereto. The semiconductor package 1121 may be a surface in which a semiconductor chip or a passive component is mounted on a package substrate in a package substrate form, but is not limited thereto. The electronic device is not necessarily limited to the smartphone 1100, but may be other electronic devices as described above.

Referring to FIG. 2, an electronic device may be, for example, a smartphone 1100. The mainboard 1110 may be accommodated in the smartphone 1100, and various electronic components 1120 may be physically and/or electrically connected to the mainboard 1110. In addition, other electronic components, such as a camera module 1130 and/or a speaker 1140, which may or may not be physically and/or electrically connected to the mainboard 1110, may be accommodated therein. A portion of the electronic components 1120 may be the above-described chip-related components, for example, a semiconductor package 1121, but are not limited thereto. The semiconductor package 1121 may be a surface in which multiple chips are mounted on a package substrate in a package substrate form, but is not limited thereto. The electronic device is not necessarily limited to the smartphone 1100, but may be other electronic devices as described above.

Figure 3:
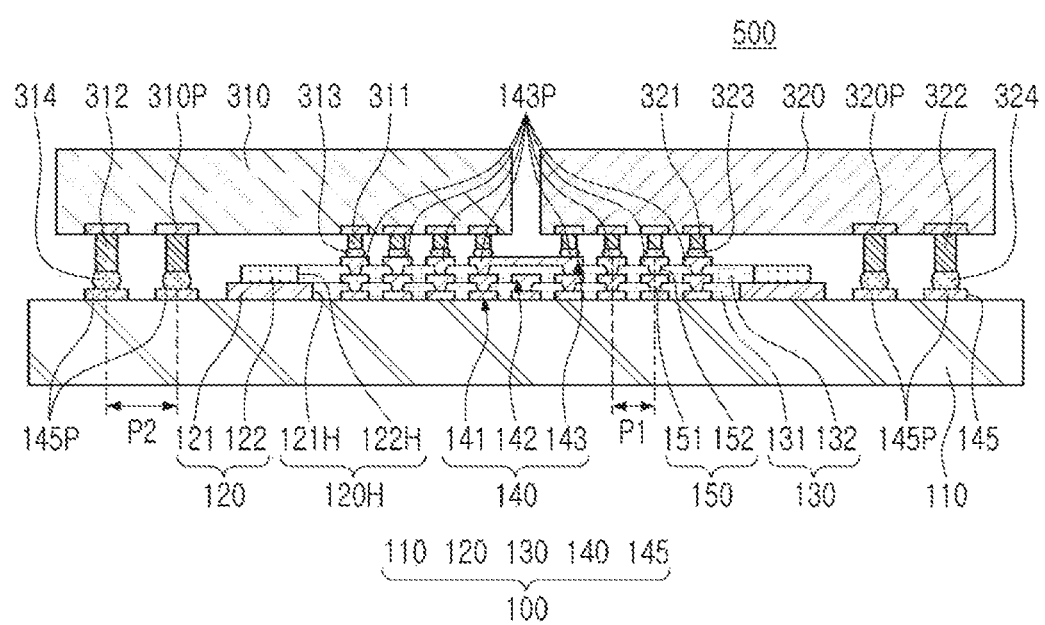
FIG. 3 is a schematic cross-sectional view of a multi-chip package according to an example.

FIG. 3 is a schematic cross-sectional view of a multi-chip package according to an example.

Figure 4:
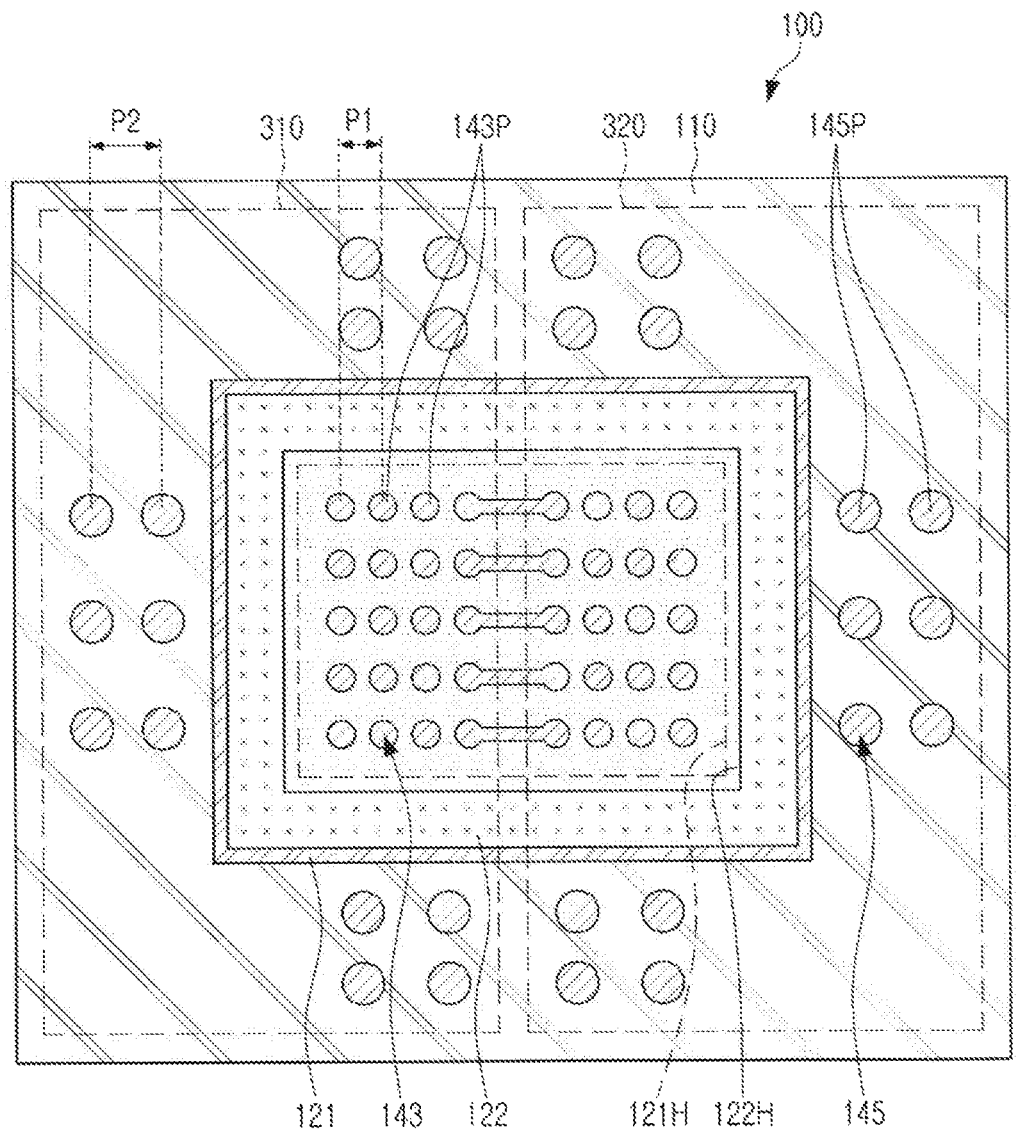
FIG. 4 is a schematic plan view of a package substrate according to the example applied to the multi-chip package in FIG. 3, when viewed from above.

FIG. 4 is a schematic plan view of a package substrate according to the example applied to the multi-chip package in FIG. 3, when viewed from above.

Referring to FIGS. 3 and 4, a multi-chip package 500 according to an example includes a package substrate 100, a first semiconductor chip 310 disposed on the package substrate 100, and a second semiconductor chip 320 disposed around the first semiconductor chip 310 on the package substrate 100. The package substrate 100 includes a substrate 110, a structure 120 disposed on the substrate 110 and having a through-portion 120H, and an insulating layer 130, a wiring layer 140, and a wiring via layer 150 disposed in the through-portion 120H on the substrate 110. The first and second semiconductor chips 310 and 320 may each be electrically connected to the wiring layer 140 of the package substrate 100, and may be electrically connected to each other through the wiring layer 140.

As described above, with the recent trend for chiplets, technologies for interconnection between chiplets have emerged. For example, a substrate including a silicon interposer, a substrate including a silicon-based interconnect bridge, capable of achieving a die-to-die electrical connection, and the like, have been developed. However, such technologies are required to manufacture expensive silicon interconnect dies. Additionally, in the case of a silicon-based interconnect bridge, a reliability issue arises due to a coefficient of thermal expansion (CTE) mismatch between a silicon material of the bridge and an organic material of a substrate.

On the other hand, the multi-chip package 500 according to an example may provide an interconnection between multiple chips through the package substrate 100 providing an organic bridge circuit. For example, the package substrate 100 according to an example may be fabricated by forming a dam-shaped structure 120 on the substrate 110 and sequentially forming a wiring layer 140, an insulating layer 130, and the like, in the through-portion 120H provided through the structure 120. In this case, rather than a silicon-based process, an organic-based process may basically be performed to reduce costs and to lower a process difficulty level. In addition, since an additional bridge die does not need to be inserted, a yield reduction risk may be lowered. In addition, a material of the insulating layer 130 may be a liquid photosensitive material, such that a fine circuit may be implemented and a degree of freedom in design may be high. Accordingly, a locally fine circuit for interconnection between multiple chips may easily be provided when it is required. In addition, heterogeneous materials may be applied only locally and there is no cavity process for inserting an additional bridge die, or the like, which is advantageous for bending control. In addition, an additional interposer substrate may be omitted, which is advantageous for a slim structure of a product. In addition, since the wiring layer 140 and the like are integrated with the substrate 110, a circuit wiring in the substrate 110 may be easily connected to the wiring layer 140 to reduce signal loss.

In the package substrate 100 according to the example structure 120, each of the insulating layer 130, the wiring layer 140, and the wiring via layer 150 may include a plurality of layers. For example, the package substrate 100 according to an example may include a first structure 121 disposed on the substrate 100 and having a first through-portion 121H, a second structure 122 disposed on the first structure 121 and having a second through-portion 122H, a first wiring layer 141 disposed in the first through-portion 121H on the substrate 100, a first insulating layer 131 disposed in the first through-portion 121H on the substrate 100 and covering at least a portion of the first wiring layer 141, a second wiring layer 142 disposed in a second through-portion 122H on the first insulating layer 131, a first wiring via layer 151 penetrating through the first insulating layer 131 in the first through-portion 121H and connecting the first and second wiring layers 141 and 142 to each other, a second insulating layer 132 disposed in the second through-portion on the first insulating layer 131 and covering at least a portion of the second wiring layer 142, a third wiring layer 143 disposed on the second insulating layer 132, and a second wiring via layer 152 penetrating through the second insulating layer 132 in the second through-portion 122H and connecting second and third wiring layers 142 and 143 to each other. As described, the number of layers in the fine circuit may be adjusted, as needed.

Meanwhile, the package substrate 100 according to an example may further include a fourth wiring layer 145 disposed on an external side of the structure 120, for example, an external side of the first structure 121 on the substrate 110. The fourth wiring layer 145 may be disposed on a level corresponding to a level of the first wiring layer 141. The fourth wiring layer 145 may be an additional circuit rather than a bridge circuit. At least a portion of the fourth wiring layer 145 may be electrically connected to at least a portion of the first wiring layer 141. Each of the first and second semiconductor chips 310 and 320 may be electrically connected to at least a portion of the fourth wiring layer 145. As described above, since the degree of freedom in design is high, a typical wiring circuit may be designed on the substrate 110 independently of the bridge circuit. In this case, as a non-limiting example, the third wiring layer 143, an uppermost wiring layer of the wiring layer 140, may include a plurality of first pads 143P having a first pitch P1, and the fourth wiring layer 145 may include a plurality of second pads 145P having a second pitch P2, and the first pitch P1 may be less than the second pitch P2. For example, the plurality of first pads 143P may be fine circuits having a finer pitch than the plurality of second pads 145P. Such a relationship may also be applied to other wiring layers in the wiring layer 140.

Hereinafter, a multi-chip package according to an example and a package substrate according to one example, included in the multi-chip package, will be described in detail with reference to drawings.

The substrate 100 may be a multilayer printed circuit board (PCB). The printed circuit board (PCB) may be a cored PCB or a coreless PCB. As a non-limiting example, the substrate 100 may be a ball grid array (BGA) type PCB. The substrate 100 may include a plurality of insulating layers, a plurality of wiring layers, and a plurality of via layers. The number of layers of the insulating layers, the wiring layers, and the via layers is not necessarily limited, and each of the insulating layers, the wiring layers, and the via layers may include multiple layers or a single layer, depending on design.

A material of the insulating layer may be an insulating material. In this case, the insulating material may be a thermosetting resin such as an epoxy resin, a thermoplastic resin such as polyimide, or materials including reinforcements such as glass fiber, glass cloth, glass fabric, and/or inorganic fillers, together with these, such as copper clad laminate (CCL), flexible copper clad laminate (FCCL), prepreg, Ajinomoto Build-up Film (ABF), photoimageable dielectric (PID), or the like. However, the insulating material is not limited thereto, and a glass plate or a ceramic plate may be used as a material of a specific insulating layer, for example, a core layer. As necessary, liquid crystal polymer (LCP) having low dielectric loss may be used. When a plurality of insulating layers are used, a material of each of the insulating layers may be the same or different from each other.

A material of the wiring layers may be a metal material. In this case, the metal material may be copper (Cu), aluminum (Al), silver (Ag), tin (Sn), gold (Au), nickel (Ni), lead (Pb), titanium (Ti), alloys thereof, or the like. The wiring layers may serve to perform various functions depending on a design of a layer of interest. For example, the wiring layers may include a ground (GND) pattern, a power (PWR) pattern, a signal (S) pattern, and the like. In this case, the signal (S) pattern may include various signals except for the ground (GND) pattern, the power (PWR) pattern, and the like, for example, a data signal, and the like. These patterns may each include a line pattern, a plane pattern, and/or a pad pattern.

A material of the via layer may also be a metal material. In this case, the metal material may be copper (Cu), aluminum (Al), silver (Ag), tin (Sn), gold (Au), nickel (Ni), lead (Pb), titanium (Ti), alloys thereof, or the like. A wiring via of each of the via layers may be completely filled with a metal material, or the metal material may be formed along a wall of a via hole. In addition, known shapes such as a tapered shape, an hourglass shape, a cylindrical shape, and the like, may all be applied thereto. The via layers may serve to perform various functions depending on a design of a layer of interest. For example, each of the wiring vias may include a wiring via for signal connection, a wiring via for ground connection, a wiring via for power connection, or the like.

The structure 120 may include first and second structures 121 and 122. The first and second structures 121 and 122 may have first and second through-portions 121H and 122H, respectively. The first and second through-portions 121H and 122H may be connected to each other to constitute a through-portion 120H. A material of the first and second structures 121 and 122 is not necessarily limited, and may be any material as long as it serves as a damp. As a non-limiting example, each of the first and second structures 121 and 122 may include a solder resist. In this case, since each of the first and second structures 121 and 122 may be easily patterned to have a desired shape, the first and second through-portions 121H and 122H may be more easily implemented. However, the present disclosure is not limited thereto, and the first and second structures 121 and 122 may include other known insulating materials. As necessary, the first and second structures 121 and 122 may include a metal material or a ceramic material.

The structure 120 may have a staircase shape when including a plurality of layers. For example, the second structure 122 may have a planar area smaller than an area of the first structure 121. Therefore, an internal wall surface of the first through-portions 121H and an internal wall surface of the second through-portions 122H may have a step with respect to each other. In addition, an external side surface of the first structure 121 and an external side surface of the second structure 122 may also have a step with respect to each other. In this regard, the second through-portions 122H may have a planar area larger than an area of the first through-portions 121H. When the structure 120 is implemented to include multiple layers through such staircase implementation, alignment may be more easily performed and the multilayer insulation layer 130, the wiring layer 140, and the wiring via layer 150 may be sequentially formed more easily.

The insulating layer 130 may include first and second insulating layers 131 and 132. The first and second insulating layers 131 and 132 may include an insulating material and, for example, a photoimageable dielectric (PID), a photosensitive insulating material. The photoimageable dielectric (PID) may be provided in a liquid state to be cured, which allows a fine circuit to be easily implemented. A boundary between the first and second insulating layers 131 and 132 may be apparent or may not be apparent.

The wiring layer 140 may include first to third wiring layers 141, 142, and 143. The first to third wiring layers 141, 142, and 143 may include a metal material. The metal material may be copper (Cu), aluminum (Al), silver (Ag), tin (Sn), gold (Au), nickel (Ni), lead (Pb), titanium (Ti), alloys thereof, or the like. The first to third wiring layers 141, 142, and 143 may serve to perform various functions depending on a design of a layer of interest. For example, the first to third wiring layers 141, 142, and 143 may include a ground (GND) pattern, a power (PWR) pattern, a signal (S) pattern, and the like. In this case, the signal (S) pattern may include various signals except for the ground (GND) pattern, the power (PWR) pattern, and the like, for example, a data signal, and the like. These patterns may each include a line pattern, a plane pattern, and/or a pad pattern. The fourth wiring layer 145 may also include the above-mentioned metal material, and may include a ground (GND) pattern, a power (PWR) pattern, a signal (S) pattern, and the like. In addition, the fourth wiring layer 145 may include a line pattern, a plane pattern, and/or a pad pattern. The patterns of the first to third wiring layers 141, 142, and 143 may be formed as fine circuits having density higher than density of the patterns of the fourth wiring layer 145, respectively.

The wiring via layer 150 may include first and second wiring via layers 151 and 152. The first and second wiring via layers 151 and 152 may include a metal material. The metal material may be copper (Cu), aluminum (Al), silver (Ag), tin (Sn), gold (Au), nickel (Ni), lead (Pb), titanium (Ti), alloys thereof, or the like. A wiring via of each of the first and second wiring via layers 151 and 152 may be completely filled with a metal material, or the metal material may be formed along a wall surface of a via hole. In addition, known shapes such as a tapered shape, an hourglass shape, a cylindrical shape, and the like, may all be applied thereto. The first and second wiring via layers 151 and 152 may also serve to perform various functions depending on a design of a layer of interest. For example, each of the first and second wiring via layers 151 and 152 may include a wiring via for signal connection, a wiring via for ground connection, a wiring via for power connection, or the like.

The first semiconductor chip 310 may be a die having a form of an integrated circuit (IC) in which hundreds to millions of or more devices are integrated in a single chip. In this case, a base material constituting the body may be silicon (Si), germanium (Ge), gallium arsenide (GaAs), or the like. Various circuits may be formed in the body. A first connection pad 310P of the first semiconductor chip 310 is provided to electrically connect the first semiconductor chip 310 to another component, and a material forming the first connection pad 310P may be a metal material such as copper (Cu), aluminum (Al), or the like, but are not limited thereto. A passivation layer may be formed on the body to expose the first connection pad 310P. The passivation layer may be an oxide layer, a nitride layer, or the like, or may be a double layer of the oxide layer and the nitride layer. An insulating layer, or the like, may be further disposed in other necessary locations. As necessary, the first semiconductor chip 310 may be a chip-scale packaged die in which a redistribution layer is formed on the body to redistribute the first connection pad 310P.

The second semiconductor chip 320 may also be a die having a form of an integrated circuit (IC) in which hundreds to millions of or more devices are integrated in a single chip. As necessary, the second semiconductor chip 320 may have a structure in which a plurality of integrated circuits (ICs) are stacked. The stacked integrated circuits IC may be electrically connected to each other through a through-silicon via (TSV). The second semiconductor chip 320 may also have a second connection pad 122P to be electrically connected to another component, and may be further provided with a passivation layer, an insulating layer, or the like. As necessary, the second semiconductor chip 320 may also be a chip-scale packaged die.

As a non-limiting example, the first semiconductor chip 310 may be an application specific integrated circuit (ASIC). Alternatively, the first semiconductor chip 310 may be a field programmable gate array (FPGA). Alternatively, the first semiconductor chip 310 may be a chipset of an application specific integrated circuit (ASIC) and a field programmable gate array (FPGA). Alternatively, the first semiconductor chip 310 may be a graphics processing unit (GPU). Alternatively, the first semiconductor chip 310 may be a chipset of an application specific integrated circuit (ASIC), a field programmable gate array (FPGA), and a graphics processing unit (GPU). In addition, the second semiconductor chip 320 may be a stacked memory such as a high bandwidth memory (HBM). Each of the first and second semiconductor chips 310 and 320 may be a relatively expensive chip having tens to millions of or more I/Os, but is not limited thereto. Each of the first and second semiconductor chips 310 and 320 may include a plurality of semiconductor chips. In this case, in a fine circuit region provided through the structure 120, the insulating layer 130, the wiring layer 140, and the wiring via layer 150 of the package substrate 100, the plurality of semiconductor chips may be formed locally and independently of each other.

At least a portion of the first semiconductor chip 310 may be disposed to overlap at least a portion of the wiring layer 140, for example, the first to third wiring layers 141, 142, and 143, when viewed from above. In addition, at least a portion of the first semiconductor chip 310 may be disposed to overlap at least a portion of the fourth wiring layer 145, when viewed from above. In this case, at least one of the plurality of first connection pads 310P of the first semiconductor chip 310 may be connected to at least one of the plurality of third pads 143P of the third wiring layer 143 through the first connection members 311 and 313. In addition, at least one of the plurality of first connection pads 310P of the first semiconductor chip 310 may be connected to at least one of the plurality of third pads 145P of the fourth wiring layer 145 through the second connection members 312 and 314.

At least a portion of the second semiconductor chip 320 may be disposed to overlap at least a portion of the wiring layer 140, for example, the first to third wiring layers 141, 142, and 143, when viewed from above. In addition, at least a portion of the second semiconductor chip 320 may be disposed to overlap at least a portion of the fourth wiring layer 145, when viewed from above. In this case, at least one of the plurality of second connection pads 320P of the second semiconductor chip 320 may be connected to at least one of the plurality of third pads 143P of the third wiring layer 143 through the third connection members 321 and 323. In addition, at least one of the plurality of second connection pads 320P of the second semiconductor chip 320 may be connected to at least one of the plurality of third pads 145P of the fourth wiring layer 145 through the fourth connection members 322 and 324.

The first to fourth connection members 311, 312, 313, 314, 321, 322, 323, and 324 may include at least one of first to fourth metal bumps 311, 312, 321, and 322 and at least one of first to fourth electrical connection metals 313, 314, 323, and 324, respectively. Each of the first to fourth connection members 311, 312, 313, 314, 321, 322, 323, and 324 may includes a plurality of connection members, and a pitch between the plurality of connection members may correspond to a pitch between a plurality of connected pads 143P and 145P. Each of the first to fourth metal bumps 311, 312, 321, and 322 may be a metal post including copper (Cu), aluminum (Al), silver (Ag), tin (Sn), gold (Au), nickel (Ni), lead (Pb), titanium (Ti), or alloys thereof, but a material thereof is not limited thereto. Each of the first to fourth electrical connection metals 313, 314, 323, and 324 may be formed of a solder, an alloy including a metal, having a low melting point, lower than a melting point of copper (Cu), for example, tin (Sn) or an alloy including tin (Sn), but is merely an example and the material is not limited thereto.

Figure 5:
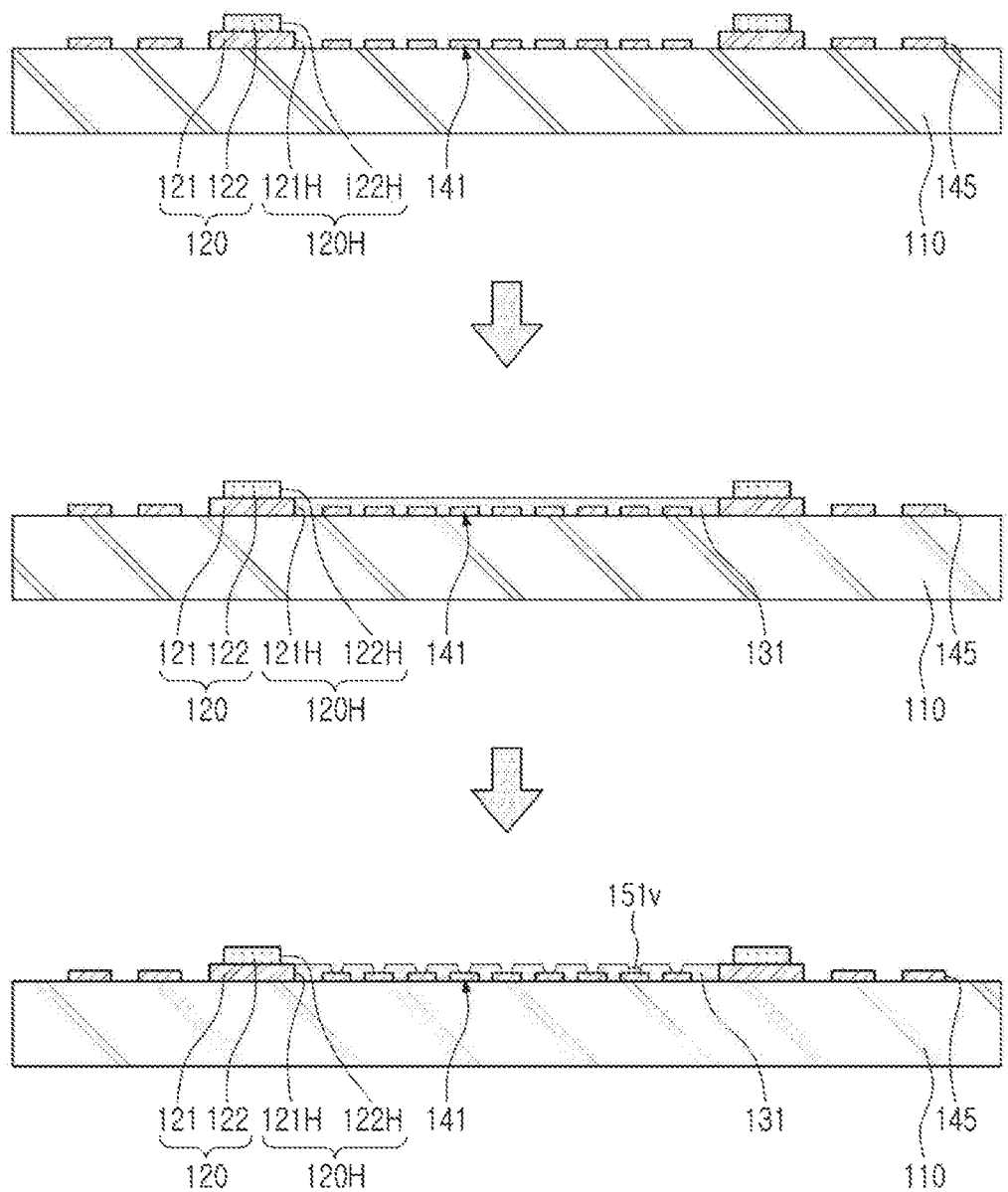
FIGS. 5 and 6 are schematic process diagrams illustrating an example of manufacturing a package substrate according to the example applied to the multi-chip package in FIG. 3.
Figure 6:
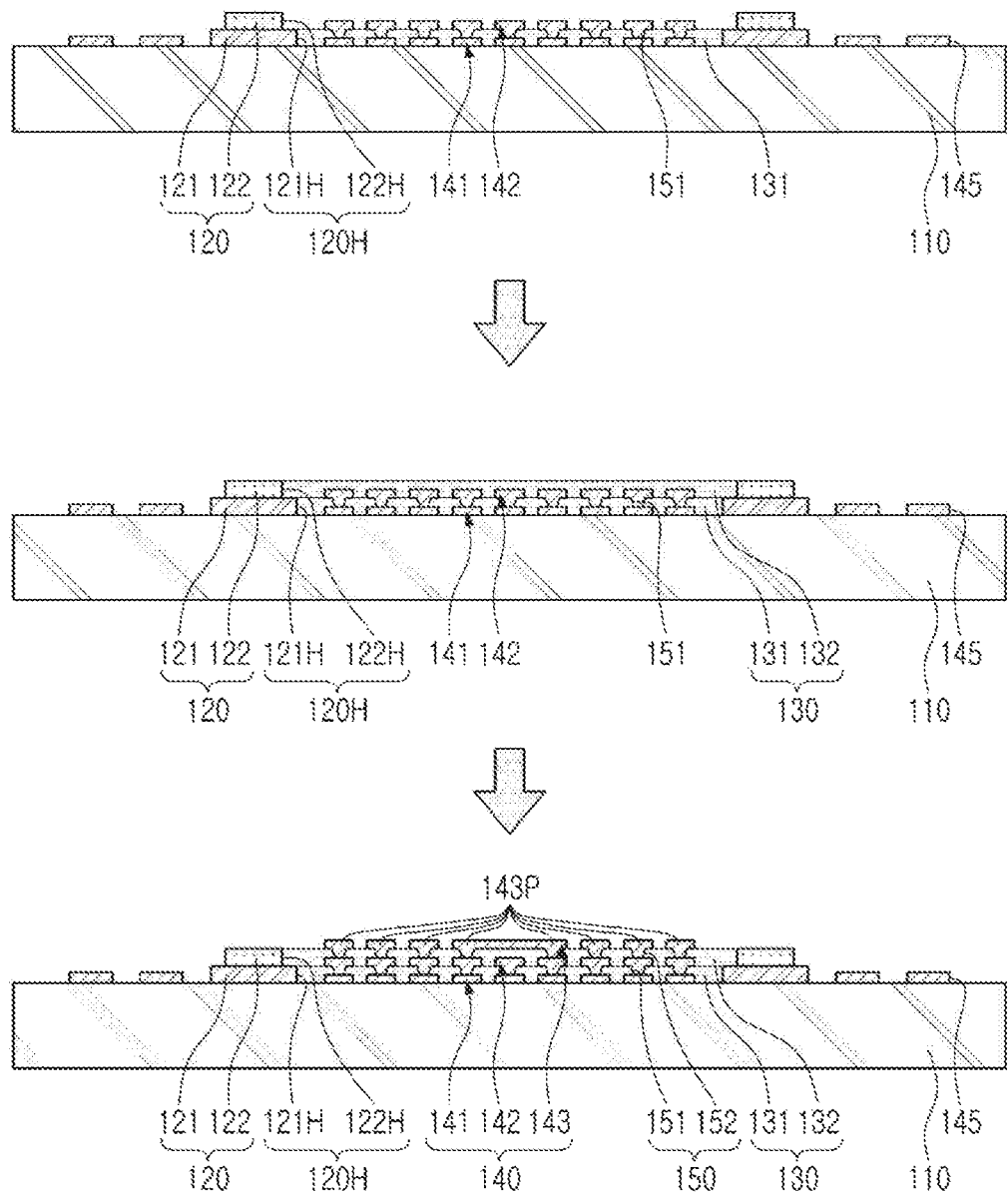

FIGS. 5 and 6 are schematic process diagrams illustrating an example of manufacturing a package substrate according to the example applied to the multi-chip package in FIG. 3.

Referring to FIG. 5, a substrate 110 is prepared. A first wiring layer 141 is formed on the substrate 110 using a plating process such as an additive process (AP), a semi-AP (SAP), a modified SAP (MSAP), tenting (TT), or the like. As necessary, a fourth wiring layer 145 is also formed in the same plating process. In this case, the first wiring layer 141 and the fourth wiring layer 145 may have the same or substantially the same thickness, and may be made of the same material. In addition, a structure 120 is formed on the substrate 110 by patterning performed through a photolithography process of a solder resist film, or patterning performed through a sandblasting, etching, or laser process of an ABF. The structure 120 may be formed of a plurality of layers depending on a design, and may be formed to include, for example, first and second structures 121 and 122. The order, in which the first and fourth wiring layers 141 and 145 and the structure 120 are formed, is not necessarily limited. The first and fourth wiring layers 141 and 145 may be formed first, and the structure 120 may be formed first. Next, a photosensitive insulating material, or the like, in a liquid state is applied to a first through-portion 121H of the first structure 121 and then cured to form a first insulating layer 131. Applying the photosensitive insulating material may be performed using various types of coating process. Next, a via hole 151v for forming a wiring via layer is formed in the first insulating layer 131 using a photolithography process or the like.

Referring to FIG. 6, a second wiring layer 142 is formed on the first insulating layer 131 by the above-mentioned plating process. In this case, the first wiring via layer 151 is also formed by filling the via hole 151v. Next, a photosensitive insulating material in a liquid state, or the like, is applied to the second through-portions 122H of the second structure 122 and then cured to form a second insulating layer 132. Applying the photosensitive insulating material may also be performed using various types of coating process. Next, a via hole for forming the second wiring via layer 152 is formed in the second insulating layer 132 using a photolithography process or the like. Then, a third wiring layer 143 is formed on the insulating layer 132 by the above-mentioned plating process. In this case, a second wiring via layer 152 is also formed by filling the via hole. Depending on the number of layers of the structure 120, a series of processes may be further repeated such that a fine circuit region is formed to have more multiple layers. As a result, the above-described package substrate 100 according to an example may be manufactured.

As described above, a package substrate, capable of providing a relatively cheap multi-chip interconnection, and a multi-chip package including the package substrate may be provided.

In addition, a package substrate, capable of lowering a yield reduction risk, and a multi-chip package including the package substrate may be provided.

In addition, a package substrate, having a high degree of freedom in wiring design, and a multi-chip package including the package substrate may be provided.

In addition, a package substrate having improved reliability, advantageous for bending control, and a multi-chip package including the package substrate may be provided.

In addition, a package substrate, capable of forming a slim structure, and a multi-chip package including the package substrate may be provided.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present disclosure as defined by the appended claims.

What is claimed is:

1. A package substrate comprising:
a substrate;
a first structure disposed on the substrate and having a first through-portion;
a first wiring layer disposed in the first through-portion on the substrate;
a first insulating layer disposed in the first through-portion on the substrate and covering at least a portion of the first wiring layer;
a second wiring layer disposed on the first insulating layer; and
a fourth wiring layer disposed on an external side of the first structure on the substrate,
wherein the first and fourth wiring layers are disposed on levels corresponding to each other.

2. The package substrate of claim 1, further comprising:
a second structure disposed on the first structure and having a second through-portion;
a second insulating layer disposed in the second through-portion on the first insulating layer; and
a third wiring layer disposed on the second insulating layer,
wherein the second wiring layer is disposed in the second through-portion on the first insulating layer, and
the second insulating layer covers at least a portion of the second wiring layer.

3. The package substrate of claim 2, wherein each of the first and second structures include a solder resist.

4. The package substrate of claim 2, wherein the second structure has a planar area less than a planar area of the first structure.

5. The package substrate of claim 2, wherein internal wall surfaces of the first and second through-portions have a step with respect to each other.

6. The package substrate of claim 4, wherein the second through-portion has a planar area larger than a planar area of the first through-portion.

7. The package substrate of claim 2, further comprising:
a first wiring via layer penetrating through the first insulating layer in the first through-portion and connecting the first and second wiring layers to each other; and
a second wiring via layer penetrating through the second insulating layer in the second through-portion and connecting the second and third wiring layers to each other.

8. The package substrate of claim 2, wherein the third wiring layer includes a plurality of first pads having a first pitch,
the fourth wiring layer includes a plurality of second pads having a second pitch, and
the first pitch is less than the second pitch.

9. The package substrate of claim 1, wherein the first structure includes a dam-shaped structure, and
the first insulating layer is disposed inside the dam-shaped structure and is spaced apart from a region outside the dam-shaped structure.

10. A multi-chip package comprising:
a package substrate including a substrate, a first structure disposed on the substrate and having a first through-portion, a first wiring layer disposed in the first through-portion on the substrate, a first insulating layer disposed in the first through-portion on the substrate and covering at least a portion of the first wiring layer, a second wiring layer disposed on the first insulating layer, and a fourth wiring layer disposed on an external side of the first structure on the substrate, wherein the first and fourth wiring layers are disposed on levels corresponding to each other;
a first semiconductor chip disposed on the package substrate and having first connection pads; and
a second semiconductor chip disposed near the first semiconductor chip on the package substrate and having second connection pads,
wherein at least one of the first connection pads and at least one of the second connection pads are connected to each other through the first wiring layer.

11. The multi-chip package of claim 10, wherein in a plan view of the multi-chip package, at least a portion of each of the first and second semiconductor chips overlaps at least a portion of the first wiring layer.

12. The multi-chip package of claim 10, wherein the package substrate further includes a second structure disposed on the first structure and having a second through-portion, a second insulating layer disposed in the second through-portion on the first insulating layer, and a third wiring layer disposed on the second insulating layer,
the second wiring layer is disposed in the second through-portion on the first insulating layer, and
the second insulating layer covers at least a portion of the second wiring layer.

13. The multi-chip package of claim 10, wherein in a plan view of the multi-chip package, at least a portion of each of the first and second semiconductor chips overlaps at least a portion of the fourth wiring layer.

14. The multi-chip package of claim 12, wherein the third wiring layer includes a plurality of first pads having a first pitch,
the fourth wiring layer includes a plurality of second pads having a second pitch, and
the first pitch is less than the second pitch.

15. The multi-chip package of claim 14, wherein at least one of the first connection pads is connected to at least one of the first pads through a first connection member, and at least one of the first connection pads is connected to at least one of the second pads through a second connection member,
at least one of the second connection pads is connected to at least one of the first pads through a third connection member, and at least one of the second connection pads is connected to at least one of the second pads through a fourth connection member, and
each of the first to fourth connection members includes at least one of a metal bump and an electrical connection member.

16. The multi-chip package of claim 10, wherein the first structure includes a dam-shaped structure, and
the first insulating layer is disposed inside the dam-shaped structure and is spaced apart from a region outside the dam-shaped structure.

17. A multi-chip package comprising:
a package substrate comprising:
a substrate;
a dam-shaped structure disposed on the substrate;
first patterns disposed inside the dam-shaped structure and on the substrate;
second patterns disposed outside the dam-shaped structure and on the substrate;
an insulating layer covering the first patterns;
a wiring layer disposed on the first insulating layer; and
a via layer disposed in the first insulating layer and connecting the first patterns to the wiring layer,
a first semiconductor chip disposed on the package substrate and having first connection pads; and
a second semiconductor chip disposed near the first semiconductor chip on the package substrate and having second connection pads,
wherein at least one of the first connection pads and at least one of the second connection pads are connected to each other through the first wiring layer, and
a portion of the first semiconductor chip and the second semiconductor chip overlaps at least a portion of the second patterns in a stacking direction of the dam-shaped structure and the substrate.

18. The multi-chip package of claim 17, wherein the insulating layer is composed of a photosensitive insulating material.

19. The multi-chip package of claim 17, wherein the insulating layer covers only the first patterns among the first patterns and the second patterns.

* * * * *